United States Patent
Haidinger et al.

(10) Patent No.: US 11,828,808 B2
(45) Date of Patent: Nov. 28, 2023

(54) BATTERY SIMULATOR HAVING COMPENSATION IMPEDANCE

(71) Applicant: KRISTL, SEIBT & CO. GESELLSCHAFT M.B.H., Graz (AT)

(72) Inventors: Thomas Haidinger, Hart bei Graz (AT); Arthur Goeldner, Faak am See (AT); Christian Auer, Graz (AT)

(73) Assignee: KRISTL, SEIBT & CO. GESELLSCHAFT M.B.H., Graz (AT)

( * ) Notice: Subject to any disclaimer, the term of this patent is extended or adjusted under 35 U.S.C. 154(b) by 188 days.

(21) Appl. No.: 17/432,053

(22) PCT Filed: Apr. 30, 2020

(86) PCT No.: PCT/AT2020/060174
§ 371 (c)(1),
(2) Date: Aug. 18, 2021

(87) PCT Pub. No.: WO2020/223748
PCT Pub. Date: Nov. 12, 2020

(65) Prior Publication Data
US 2022/0196742 A1    Jun. 23, 2022

(30) Foreign Application Priority Data
May 3, 2019   (AT) .............................. A 50401/2019

(51) Int. Cl.
*G01R 31/367* (2019.01)
*G01R 31/389* (2019.01)
(Continued)

(52) U.S. Cl.
CPC ......... *G01R 31/367* (2019.01); *G01R 31/388* (2019.01); *G01R 31/389* (2019.01); *G01R 31/3865* (2019.01)

(58) Field of Classification Search
None
See application file for complete search history.

(56) References Cited

U.S. PATENT DOCUMENTS

| 2008/0111649 A1* | 5/2008 | Ryu ..................... G09G 3/3688 345/55 |
| 2013/0002368 A1 | 1/2013 | Zhu et al. |

(Continued)

FOREIGN PATENT DOCUMENTS

| CN | 203101562 U | 7/2013 |
| CN | 107592138 A | 1/2018 |

(Continued)

OTHER PUBLICATIONS

"Stabilizing Fast Transient Response Power Supply/Load Circuits," TEK Website, Available Online at https://download.tek.com/document/_2870_Stabilizing_AN.pdf, Jan. 1, 2007, 6 pages.

(Continued)

*Primary Examiner* — Jas A Sanghera
(74) *Attorney, Agent, or Firm* — McCoy Russell LLP

(57) ABSTRACT

The invention relates to a device for testing, in particular high-frequency testing, a test item, for example an electrical machine or a converter, comprising:
- a simulation unit for simulating an electrical energy accumulator using a simulation model; and
- an electrical connection line, via which the test item can be connected to the simulation unit; wherein the device comprises compensation impedance for compensating for an impedance in accordance with a line inductance of the connection line.

14 Claims, 2 Drawing Sheets

(51) Int. Cl.
*G01R 31/385* (2019.01)
*G01R 31/388* (2019.01)

(56) References Cited

U.S. PATENT DOCUMENTS

2015/0268285 A1* 9/2015 Loftus .................... B60L 50/61
  324/503
2018/0017630 A1* 1/2018 Schipfer .............. G01R 31/396

FOREIGN PATENT DOCUMENTS

| | | |
|---|---|---|
| DE | 29621472 U1 | 3/1997 |
| DE | 102011054370 A1 | 1/2012 |
| DE | 102012217973 A1 | 4/2014 |
| KR | 100652728 B1 | 12/2006 |
| WO | 2013174967 A1 | 11/2013 |

OTHER PUBLICATIONS

Buccolini, L. et al., "Cell Battery Emulator for Hardware-in-the-Loop BMS Test," Proceedings of the 2018 IEEE International Conference on Environment and Electrical Engineering and 2018 IEEE Industrial and Commercial Power Systems Europe (EEEIC / I&CPS Europe), Jun. 12, 2018, Palermo, Italy, 5 pages.

ISA European Patent Office, International Search Report Issued in Application No. PCT/AT2020/060174, Sep. 8, 2020, WIPO, 3 pages.

* cited by examiner

BATTERY SIMULATOR HAVING COMPENSATION IMPEDANCE

CROSS REFERENCE TO RELATED APPLICATIONS

The present application is a U.S. National Phase of International Application No. PCT/AT2020/060174 entitled "BATTERY SIMULATOR HAVING COMPENSATION IMPEDANCE," and filed on Apr. 30, 2020. International Application No. PCT/AT2020/060174 claims priority to Austrian Patent Application No. A 50401/2019 filed on May 3, 2019. The entire contents of each of the above-listed applications are hereby incorporated by reference for all purposes.

TECHNICAL FIELD

The invention relates to a device for the testing, in particular the high-frequency testing, of a test item, for example of an electrical machine or a converter, having:

a simulation unit for the simulation of an electrical energy storage with the aid of a simulation model, and an electrical connecting line, by way of which the test item can be connected to the simulation unit.

BACKGROUND AND SUMMARY

The invention furthermore relates to a method for the testing, in particular the high-frequency testing, of a test item, for example of an electrical machine or a converter, in which the test item is connected to a simulation unit by way of an electrical connecting line, wherein the simulation unit simulates an electrical energy storage with the aid of a simulation model.

The voltage of an energy storage, such as a battery or an accumulator, is not constant, but depends on the profile of the present and past current flow, on the state of charge, the temperature, the ageing of the energy storage, and many other things. If one wants to operate realistically a battery or accumulator-powered test item, for example an electric drive unit of a vehicle, or a converter, on the test rig, one could use a real battery. However, the time required to bring the battery into the desired state (state of charge, temperature, ageing, etc.) before each test, would be enormous, and would not always be reliably reproducible. For this reason a simulation unit, a so-called battery simulator or battery emulator, is usually used on the test rig. Roughly speaking, the simulation unit is essentially a controllable voltage source that outputs a voltage calculated by the simulation model, and makes it available to the test item. At the same time the simulation model also specifies the impedance of the simulation unit.

In order not to have to reposition and set up the simulation unit, which is usually a heavy and sensitive, for each test, a flexible connecting line, several metres long, is, as a rule, used on the test rig. This connecting line is used to connect the test item to the simulation unit during the test, and to supply it with current and voltage.

Battery simulators are known in the prior art from WO 2013/174967 A1 and DE 296 21 472 U1, amongst others.

Modern drive units are often operated on fast-switching converter units. For test purposes, these are often tested on test rigs with devices of the type mentioned in the introduction. However, it is problematic that, especially at high switching frequencies, the voltage actually provided to the test item sometimes deviates considerably from the voltage specified by the simulation model, and high-frequency voltage fluctuations can occur. This can lead to the test item switching off due to over- or undervoltage, or to the test item being damaged. Compensation of this deviation by means of the simulation model has not yet been possible, not least because of the increase in voltage through the simulation unit theoretically necessary for this purpose. Tests on fast-switching test items can therefore not be carried out reliably.

It is therefore an object of the present invention to alleviate, or even completely eliminate, the disadvantages of the prior art. In particular, it is the object of the present invention to minimize, or eliminate, the deviations between the voltage provided to the test item, and the voltage specified by the simulation model, thereby enabling reliable testing, even at high switching frequencies of the test items.

This object is achieved by means of the features of the characterising part of claim 1. Accordingly, the device is characterised in that the device comprises a compensation impedance for the compensation of an impedance as a consequence of a line inductance of the connecting line.

Advantageously, the influence of the inductive, frequency-dependent component of the line impedance of the connecting line can be compensated for with the aid of the compensation impedance, such that reliable testing of a test item on the device is also possible at higher frequencies. In this context, "higher frequencies" or "high frequency" means frequencies of the voltage and current of at least 300 Hz, in particular of at least 1,000 Hz, preferably of at least 3,000 Hz.

The invention is here based on the knowledge that fluctuations in the voltage and the deviations between the voltage specified by the simulation model, and the voltage actually provided to the test specimen at the end of the connecting line, are primarily due to the resistance and inductance per unit length of the connecting line. Here the capacitance per unit length can be neglected by virtue of its minor influence. The resistance and inductance per unit length of the connecting line form the line impedance of the connecting line, and, without any compensation, lead to the fact that the source impedance of the device that is "visible" from the test item in the connected state is increased, and the latter therefore deviates from the impedance of the simulation unit. Here the "visible" source impedance of the test item is formed by an impedance of the simulation unit and the line impedance of the connecting line. The longer the connecting line, the greater is this deviation.

By virtue of the line inductance, that is to say, the impedance resulting from the line inductance, the magnitude of the line impedance, and thus the magnitude of the source impedance, increases with increasing frequency. As described above, this leads to problems, especially at high frequencies, because the impedance of the simulation unit is not presented to the test item as actually desired, but rather the increased source impedance.

The compensation impedance in accordance with the invention can counteract the problems described. In particular, with the compensation impedance in accordance with the invention, as already mentioned, it is possible to minimise, or completely eliminate, the influence of the line inductance of the connecting line by means of selection of suitable parameters. This is done by adjusting, i.e. altering, the source impedance that is visible from the test item in the connected state by means of the compensation impedance. The value of the source impedance can be adjusted to a specified value, which can originate, for example, from the simulation model. For example, the source impedance can be altered such that the source impedance corresponds to the (original) impedance of the simulation unit. The influence of the connecting line is thereby eliminated. In this case, the device acts on the test item as if the latter were connected directly to the simulation unit, without a connecting line.

In other words, by using the compensation impedance and, if necessary, altering the original impedance of the simulation unit, it is possible to set a source impedance of the device that corresponds to the originally desired value of the impedance of the simulation unit specified by the simulation model. If necessary or appropriate, an alteration, in particular a reduction, of the impedance of the simulation unit can also be undertaken.

Expediently, the compensation impedance can have an ohmic component and a capacitive component. By means of the compensation impedance and at the same time, if necessary, an alteration, in particular a reduction, of the impedance of the simulation unit, compensation can be made, on the one hand, for the influence of the line resistance of the connecting line, which already occurs at a frequency of 0 Hz, and is approximately constant over the entire frequency range, and on the other hand, for the influence of the line inductance, which gains in influence, in particular at frequencies above 300 Hz.

The simulation unit, which is also referred to as a battery simulator, or a battery emulator, can have a computing unit, such as a computer, or a microprocessor unit. The computing unit is capable of executing or calculating the simulation model, and of outputting a voltage and/or current in accordance with the simulation model at an output of the simulation unit. By this means, networks consisting of resistances, inductances and capacitances can quickly be simulated. The simulation unit thus represents a feedforward controllable or feedback controllable voltage source. The component values depend on the operating state of the simulated energy storage unit and are specified by the simulation model. The simulation model thus specifies the impedance of the simulation unit. The connecting line can be connected to the output of the simulation unit. A multi-pole cable, for example a two-pole cable, preferably with a low line inductance, can be provided as the connecting line.

In a preferred form of embodiment, provision is made for the compensation impedance to be electrically arranged in parallel with the test item. By means of this, any possible negative influence of the compensation impedance at low frequencies is avoided.

A simple adjustment of the source impedance ensues, if the compensation impedance is arranged at an end of the connecting line facing towards the test item, preferably between the end of the connecting line facing towards the test item and the test item, in particular in a connecting unit. By arranging it close to the test item, compensation for the influences of the connecting line can be made particularly efficiently. The connecting unit can have at least one screw terminal, one plug and/or one coupling unit, with which the test item can be directly connected.

For the generation of a resistive and a capacitive component, the compensation impedance can have an ohmic compensation resistor and a compensation capacitor, wherein the compensation resistor and the compensation capacitor are preferably electrically connected in series. By means of the compensation capacitor, the advantage ensues that the influence of the compensation resistor on the source impedance can be kept low at low frequencies.

In order to be able to take into account at any time alterations of the simulation model and other influences, such as temperature fluctuations, it can be advantageous if an adjustable resistor is provided as the ohmic compensation resistance, and/or an adjustable capacitor is provided as the compensation capacitor. The compensation resistor and the compensation capacitor can, for example, be mechanically adjustable. A potentiometer can, for example, be provided as the compensation resistor. However, switchable resistor networks for the compensation resistor, or switchable capacitor networks for the compensation capacitor, can also be provided. These can be controlled manually and/or electronically.

In a particularly preferred form of embodiment, provision can be made for the compensation impedance to adapt a source impedance formed from a line impedance of the connecting line and the impedance of the simulation unit, such that the source impedance corresponds to a specified ohmic resistance. The source impedance visible from the test item is thus (neglecting capacitive components) a purely ohmic resistance. For the test item, the device therefore acts as if it were connected to an energy storage with an ohmic source impedance.

In addition, an adjustment, in particular a reduction, of the impedance of the simulation unit can expediently be undertaken, in order to reduce the source impedance. The specified resistance can take the form of a general ohmic resistance, or a purely ohmic impedance of the simulation unit, originally specified by the simulation model.

In one form of embodiment, provision can be made for the value of the compensation resistor to be essentially equal to the value of the specified resistance.

Here it is advantageous if the impedance of the simulation unit corresponds to an ohmic internal resistance, which is dimensioned in accordance with the formula $R_I = R_S - R_L$, where $R_S$ denotes the specified ohmic resistance, and $R_L$ denotes an ohmic line resistance of the connecting line. By this means compensation can advantageously be made for the line resistance.

Furthermore, it is opportune if the compensation capacitor is dimensioned in accordance with the formula $C_P = L_L / R_P^2$, where $L_L$ denotes a line inductance of the connecting line, and $R_P$ denotes the compensation resistor.

By means of the above-cited choice of parameters, the source impedance is advantageously adapted to a specified value, not only at a specific frequency, but also over the entire frequency range. In summary, the source impedance can be adapted in a particularly efficient manner if the impedance of the simulation unit corresponds to $R_I = R_S - R_L$, the capacitance value of the compensation capacitor is $C_P = L_L / (R_P^2)$, and the value of the compensation resistor essentially corresponds to the specified ohmic resistance. Then the source impedance also advantageously corresponds to the specified resistance.

Furthermore, the above-stated object is achieved by a method of the type mentioned in the introduction, which is characterised by the fact that a compensation impedance $Z_K$ is used to compensate for an impedance resulting from a line inductance $L_L$ of the connecting line.

The advantages and features described in relation to the device are also fully applicable to the method.

BRIEF DESCRIPTION OF THE FIGURES

In what follows, the invention is described in more detail on the basis of figures, although there is no intention that the invention should be limited to these.

DETAILED DESCRIPTION

Figure 1:
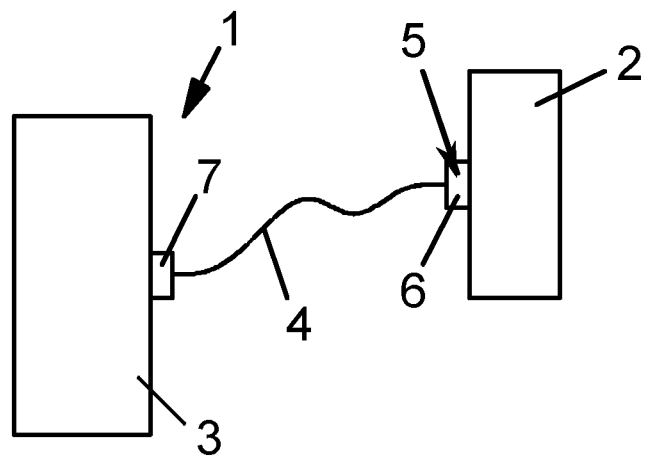
FIG. 1 shows a simplified representation of the device in accordance with the invention, with a test item connected to the device.

FIG. 1 shows a simplified representation of the device 1 in accordance with the invention, to which is connected a test item 2 in the form of an electric drive unit. The device 1 has a simulation unit 3 for the simulation of an electrical energy storage, for example a battery or an accumulator, and an electrical connecting line 4, at the end of which is located a connecting unit 5, with a plug and/or coupling unit 6. However, screw terminals can also be provided on the connecting unit 5. The plug and/or coupling unit 6 is connected to the test item 2, and establishes an electrical connection between the test item 2 and the simulation unit 3.

The simulation unit 3 can be formed by a computer or a microprocessor, and can provide a current and a voltage in accordance with a simulation model by way of an output 7. Current and voltage are transferred to the test item 2 by way of the connecting line 4. The simulation unit 3 thus essentially corresponds to a feedforward controllable voltage source.

Such simulation units 3 are also called battery simulators or battery emulators, and enable the simulation of the operation of a test item 2 on an energy storage. With the aid of a simulation model, various operating points of an energy storage can be simulated, without the need to use a real energy storage. The use of a real energy storage would represent an enormous effort, as it would first have to be brought up to the desired operating point (temperature, charge, etc.). For this reason, simulation units 3 have become established for test purposes.

In many cases, modern electrical drive units are operated on fast-switching converters, that is to say, at high (fundamental) frequencies of current and voltage. However, what is problematic is that, especially at high frequencies, the voltage provided to the test item 2 sometimes deviates massively from the voltage at the output 7 of the simulation unit 3 as specified by the simulation model.

Figure 2:
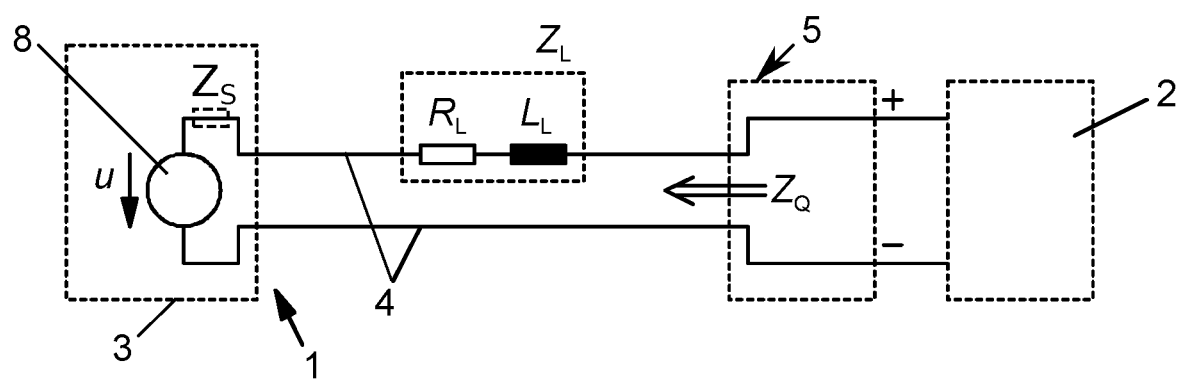
FIG. 2 shows an equivalent circuit diagram of the device in accordance with the invention, with a test item connected to the device.
Figure 3:
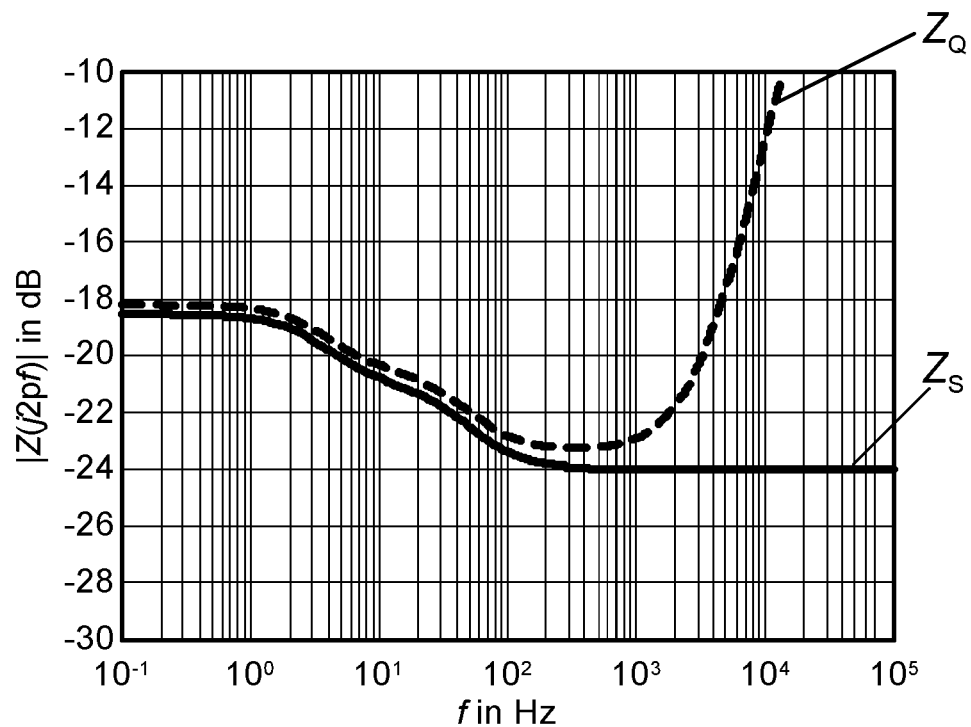
FIG. 3 shows an amplitude response of the source impedance without compensation, and the amplitude response of the impedance of the simulation unit.

The following cause of this problem has been identified, and this will be illustrated by means of FIGS. 2 and 3.

FIG. 2 shows an equivalent circuit diagram of the device 1 in accordance with the invention, with a test item 2 connected to the device 1. The connecting line 4 essentially has a resistance per unit length and an inductance per unit length, which are shown in FIG. 2 as concentrated components $R_L$ and $L_L$. $R_L$ denotes the line resistance, and $L_L$ denotes the line inductance, of the connecting line 4. Any capacitance per unit length is neglected in the further visualisation because of its minor influence. The actual values of the components $R_L$ and $L_L$ depend on the geometry of the connecting line 5. The anticipated value of the line resistance $R_L$ lies in the range of a few mΩ, while the anticipated value of the line inductance $L_L$ lies in the range of a few μH. Together the line resistance $R_L$ and the line inductance $L_L$ (neglecting any capacitive component) form a line impedance $Z_L$. The simulation unit 3 is represented as a voltage source 8, and has an impedance $Z_S$ (shown by a dashed line), which ensues from the simulation model used, that is to say, is specified by the latter.

The resistance per unit length and the inductance per unit length now have an effect on the impedance of the device 1 that the test item "sees". This impedance is called the source impedance $Z_Q$, and to begin with is essentially composed of the impedance $Z_S$ of the simulation unit 3 and the line impedance $Z_L$. By virtue of the resistance per unit length and the inductance per unit length, the source impedance $Z_Q$ "seen" by the test item deviates from the impedance $Z_S$ of the simulation unit 3, especially at frequencies >300 Hz. This can be seen in FIG. 3, which shows the amplitude response in dB of the source impedance $Z_Q$ as presented to the test item 2 (dashed line), and the amplitude response of the impedance $Z_S$ of the simulation unit 3 (solid line). Two phenomena can be observed here:

At low frequencies, the source impedance $Z_Q$ is slightly increased. This is caused by the line resistance $R_L$, which is essentially constant over all frequencies.

2) At high frequencies, the source impedance $Z_Q$ increases sharply. This is denoted as a high-frequency separation between the simulation unit 3 and the test item 2, and is primarily caused by the line inductance $L_L$.

The increase of the source impedance $Z_Q$ caused by the line inductance $L_L$ cannot be corrected by alterations to the simulation model. It would be desirable if the source impedance $Z_Q$ as presented to the test item were to correspond to the impedance $Z_S$ of the simulation unit. In other words, the influence of the connecting line 4 should be eliminated, and the source impedance $Z_Q$ should correspond to a specified value, for example a general impedance, or the impedance $Z_S$ of the simulation unit 3. For this purpose, the impedance $Z_S$ of the simulation unit 3 is subsequently also adapted, that is to say, altered, which is why, if the source impedance $Z_Q$ is to correspond to the impedance $Z_S$ of the simulation unit 3, one also talks about the original impedance $Z_S$ of the simulation unit 3.

Figure 4:
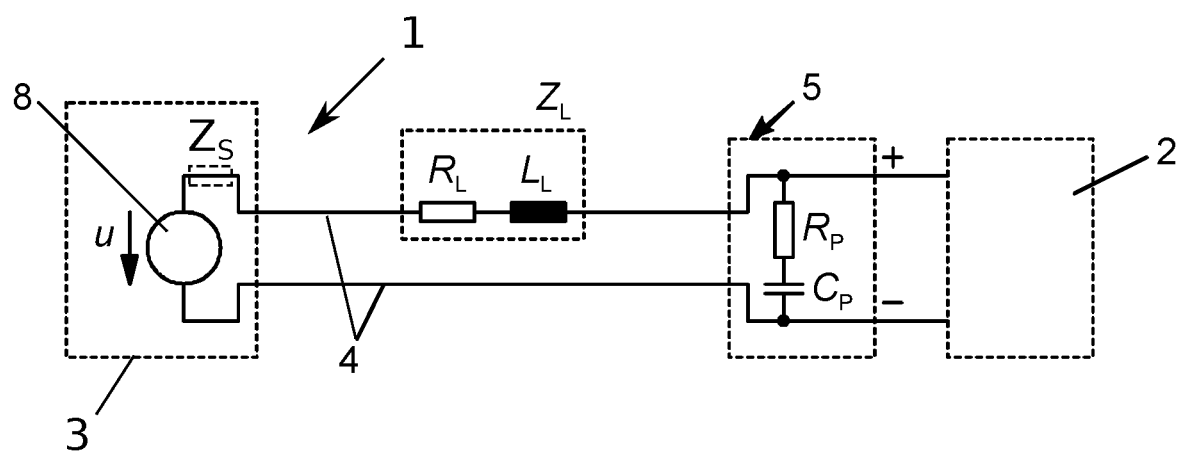
FIG. 4 shows an equivalent circuit diagram of the device in accordance with the invention, with a test item connected to the device, and a compensation impedance $Z_K$.

In accordance with the invention, a compensation impedance $Z_K$ is provided for the adaptation of the source impedance $Z_Q$. With the aid of the compensation impedance $Z_K$, the source impedance $Z_Q$ as presented to the test item 2 can be adapted, that is to say, altered. This will be explained with reference to FIG. 4.

FIG. 4 again shows an equivalent circuit diagram of the device 1 in accordance with the invention, with a connected test item 2. In accordance with the invention, however, the compensation impedance $Z_K$ is provided in the connecting unit 5. This consists of a compensation capacitor $C_P$ and an ohmic compensation resistor $R_P$. The compensation capacitor $C_P$ and the compensation resistor $R_P$ are electrically connected in series. The compensation impedance $Z_K$ is electrically connected in parallel with the test item 2. In order to be able to make adaptations in a simple manner, the compensation capacitor $C_P$ and/or the compensation resistor $R_P$ can be designed to be adjustable.

The source impedance $Z_Q$, formed from the point of view of the test item 2, is calculated from the parallel connection of the compensation impedance $Z_K$ and the series connection made up from the line impedance $Z_L$ and the impedance $Z_S$ of the simulation unit 3:

$$Z_Q(s) = \frac{(Z_S(s) + R_L + sL_L)\left(R_P + \frac{1}{sC_P}\right)}{Z_S(s) + R_L + sL_L + R_P + \frac{1}{sC_P}} \quad \text{(Equation 1)}$$

Here the variable "s" corresponds to what is in general the complex Laplace variable of the Laplace transformation. To make it clear that the impedances $Z_Q$ and $Z_S$ can in general take the form of frequency-dependent impedances, the variable (s) has been added to these impedances in the equations. If the source impedance $Z_Q$ is to correspond to a specified value $Z_{SOLL}$, the following must apply:

$$Z_{SOLL}(s) = Z_Q(s) = \frac{(Z_S(s) + R_L + sL_L)\left(R_P + \frac{1}{sC_P}\right)}{Z_S(s) + R_L + sL_L + R_P + \frac{1}{sC_P}}. \quad \text{(Equation 2)}$$

Equation 2 can be transformed into $$Z_S(s) = \frac{Z_{SOLL}(s)[s^2 L_L C_P + s(R_L + R_P)C_P + 1] - [s^2 L_L R_P C_P + s(R_L R_P C_P + L_L) + R_L]}{s(R_P - Z_{SOLL}(s))C_P + 1} \quad \text{(Equation 3)}$$

and indicates how the impedance $Z_S$ of the simulation unit 3 must be selected for a given source impedance $Z_Q=Z_{SOLL}$. Here Equation 3 applies quite generally for the impedance $Z_S$ of the simulation unit 3.

Simply stated, provision must now be made for the source impedance $Z_Q$ to correspond to a constant specified ohmic resistance $Z_{SOLL}=R_S$. The specified resistance $R_S$ can be, for example, the value that the simulation model would have provided for the test item 2, but which would have been falsified by virtue of the connecting line 4. With this in mind, Equation 3 can be transformed as follows:

$$Z_S(s) = \frac{s^2(R_S - R_P)L_L C_P + s[(R_S - R_P)R_L C_P + R_S R_P C_P - L_L] + (R_S - R_L)}{s(R_P - R_S)C_P + 1}. \quad \text{(Equation 4)}$$

By virtue of the higher degree numerator (see the Laplace variable s) in Equation 4, one is dealing here with an impedance $Z_S$ that cannot be implemented. If now $R_P$ is chosen to be equal to $R_S$, one obtains $$Z_S(s) = s(R_S R_P C_P - L_L) + (R_S - R_L), \quad \text{(Equation 5)}$$

which, however, is still an impedance that cannot be implemented.

By means of the selection $$C_P = \frac{L_L}{R_S R_P} = \frac{L_L}{R_P^2} \quad \text{(Equation 6)}$$

Equation 5 advantageously simplifies to $$Z_S(s) = (R_S - R_L). \quad \text{(Equation 7)}$$

This at last represents an impedance $Z_S$ of the simulation unit 3 that can be implemented, and which corresponds to a frequency-independent, ohmic resistance. The impedance $Z_S$ of the simulation unit in Equation 6 corresponds to the specified resistance $R_S$ reduced by the line resistance $R_L$. By the above selection of the parameters $R_P$ and $C_P$, the influence of the line inductance can therefore be eliminated, and there ensues an ohmic resistance value of the impedance $Z_S$ of the simulation unit 3 that is particularly easy to form. By the subtraction of $R_L$ from $R_S$, compensation is made for the ohmic line resistance $R_L$.

The above assumptions and results serve as an example of embodiment, and can be summarised and interpreted as follows: in order to alter the source impedance $Z_Q$ of the device as presented to the test item 2, such that it corresponds to a predetermined ohmic resistance value $R_S$, it is opportune if the impedance $Z_S$ of the simulation unit 3 corresponds to the resistance value $R_S-R_L$. In other words: the impedance $Z_S$ of the simulation unit should correspond to the specified resistance $R_S$, reduced by the line resistance $R_L$. Furthermore, the capacitance of the compensation capacitance $C_P$ should be selected in accordance with Equation 6, and the compensation resistance $R_P$ should correspond to the specified resistance $R_S$.

The invention claimed is:

1. A device for testing, of a test item comprising:
   a simulation unit for simulation of an electrical energy storage with the aid of a simulation model, and
   an electrical connecting line, by way of which the test item can be connected to the simulation unit,
   wherein, the device has a compensation impedance for compensation of an impedance resulting from a line inductance of the connecting line
   wherein, the compensation impedance is arranged such that, in a connected state of the test item, the compensation impedance is electrically arranged in parallel with the test item,
   wherein, the compensation impedance has an ohmic compensation resistor and a compensation capacitor,
   wherein, the compensation impedance adapts a source impedance, which source impedance is formed from a line impedance of the connecting line and an impedance of the simulation unit, such that the source impedance corresponds to a specified ohmic resistance.

2. The device according to claim 1, wherein, the compensation impedance is arranged at an end of the connecting line facing towards the test item.

3. The device according to claim 2, wherein the compensation impedance is arranged between the end of the connecting line facing towards the test item, and the test item.

4. The device according to claim 2, wherein the compensation impedance is arranged in a connecting unit.

5. The device according to claim 1, wherein, an adjustable resistor is provided as the compensation resistor, and/or, an adjustable capacitor is provided as the compensation capacitor.

6. The device according to claim 1, wherein, the value of the compensation resistor essentially corresponds to the value of the specified resistance.

7. The device according to claim 6, wherein, the impedance of the simulation unit corresponds to an ohmic internal resistance, dimensioned according to the formula $R_I=R_S-R_L$, wherein $R_S$ denotes the specified ohmic resistance, and $R_L$ denotes an ohmic line resistance of the connecting line.

8. The device according to one of the claim 1, wherein, the compensation capacitor is dimensioned according to the formula $C_P=L_L/(R_P^2)$, wherein $L_L$ denotes a line inductance of the connecting line, and $R_P$ denotes the compensation resistor.

9. The device according to claim 1, wherein the testing is a high frequency testing.

10. The device according to claim 1, wherein the test item is an electrical machine or a converter.

11. The device according to claim 1, wherein the compensation resistor and the compensation capacitor are electrically connected in series.

12. A method for the testing of a test item, in which the test item is connected to a simulation unit by way of an electrical connecting line, wherein the simulation unit simulates an electrical energy storage with the aid of a simulation model, wherein, a compensation impedance is used to compensate for an impedance, resulting from a line inductance of the connecting line, wherein the compensation impedance is electrically arranged in parallel with the test item,
- wherein, the compensation impedance has an ohmic compensation resistor and a compensation capacitor,
- wherein, the compensation impedance adapts a source impedance, which source impedance is formed from a line impedance of the connecting line and an impedance of the simulation unit, such that the source impedance corresponds to a specified ohmic resistance.

13. The method according to claim 12, wherein the testing is a high frequency testing.

14. The method according to claim 12, wherein the test item is an electrical machine or a converter.

* * * * *